United States Patent
Huang et al.

[11] Patent Number: 5,892,701
[45] Date of Patent: Apr. 6, 1999

[54] SILICON FILTERING BUFFER APPARATUS AND THE METHOD OF OPERATION THEREOF

[75] Inventors: Mark Po Shaw Huang; Phil Wen Lung Hsieh, both of Taipei, Taiwan

[73] Assignee: Tamarack Microelectronics, Inc., Taipei, Taiwan

[21] Appl. No.: 696,797

[22] Filed: Aug. 14, 1996

[51] Int. Cl.$^6$ .................................................. G06G 7/02
[52] U.S. Cl. ............................................................. 364/825
[58] Field of Search ..................... 364/724.011, 724.012, 364/724.1, 724.17, 724.19, 825; 360/46, 55; 341/143, 155; 375/350, 373

[56] References Cited

U.S. PATENT DOCUMENTS

| | | | |
|---|---|---|---|
| 5,325,318 | 6/1994 | Harris et al. | 364/724.1 |
| 5,521,946 | 5/1996 | Main | 375/350 |
| 5,592,340 | 1/1997 | Minuhin et al. | 360/46 |
| 5,650,954 | 7/1997 | Minuhin | 364/825 |

*Primary Examiner*—Emmanuel L. Moise
*Attorney, Agent, or Firm*—Bacon & Thomas, PLLC

[57] ABSTRACT

A silicon active analog filtering buffer apparatus and its method of operation is disclosed to receive an input signal and generates a synthesized output signal. The apparatus comprises a pulse generator for receiving the input signal and producing a sequence of delayed signal pulses in response to the input signal. A control logic circuit is connected to the pulse generator for generating scheduling on/off operation control signals. An array of switched current sources includes a number of switch means each connected to the control logic for receiving a corresponding one of the generated scheduling on/off operation control signals for shaping pre-determined waveforms. An output stage providing an amplified 15 current output for shaping to form the synthesized output signal. No complex computational procedure is necessary for the creation of the output filtered signal. Power consumption, as well as device physical dimensional characteristics are both reduced. Improvements of filter characteristics are achieved.

20 Claims, 7 Drawing Sheets

5,892,701

SILICON FILTERING BUFFER APPARATUS AND THE METHOD OF OPERATION THEREOF

BACKGROUND OF THE INVENTION

1. Field of the Invention

The present invention relates in general to active analog filters. In particular, the present invention relates to silicon active analog filtering buffer apparatus. More particularly, the present invention relates to a silicon active filtering buffer apparatus and the method of operation thereof employing waveform shaping over input signal to obtain filtered output without complex computations.

2. Technical Background

Conventional electronic filters are made of many inductive coils and capacitors arranged in ladder-like connections. This type of passive filters provides neither voltage nor current gain, and features low output impedance that makes them barely suitable for applications such as, for example, 100/10 MHz Mixed Fast Ethernet network applications. The bulky physical size of these passive filters also make them un-fit for applications such as PCMCIA peripheral cards which place severe requirements in component spacing.

Active filters fabricated as semiconductor devices are designed to replace, as well as enhance, filtering performance characteristics of passive filters. These active filters can be generally differentiated in two categories based on the technique of their implementation. One category is based on the analog filtering technique. The other is based on the DSP (digital signal processing) filtering technique in which all signals to be actively filtered are converted into binary data and then crunched. The processed digital data is then converted back into analog form by D/A converter.

Conventional active analog filters may be categorized into three general types. They are, namely, switched-capacitor filters, active operational amplifier (OP AMP) filters, and continuous-time filters.

Switched-capacitor filters employ switches for the emulation of resistors with large resistance values. With the assistance of active amplifiers, they may achieve the required filtering functionality. However, when the frequency of signals filtered increases, switched-capacitor filters suffer from disadvantageous effects such as signal feed-through and limitation over bandwidth gain.

An active OP AMP filter is basically a connection of resistor and capacitor network that employs the assistance of selected functional features of the OP AMP included to achieve the desired filtering functional characteristics, OP AMP's have, however, never been ideal in providing the necessary functionality in this category of active filters and have filtering bandwidth limitations, which render this type of active analog filters virtually useless in high frequency applications.

Continuous-time filters use the somewhat higher performance transconductor approach to emulate inductors or large-value capacitors necessary for implementing active analog filtering. With proper interconnection, better performance can be achieved. However, non-ideal effects of transconductors still place inadvertent effects on the performance of this type of active filter. Stability has been a major concern. Also, this type of filters suffer from small output voltage swings, making it difficult for delivering large signals in occasions of heavy loading. Power consumption is another concern. A transconductor and a capacitor are used to emulate one active component such as an inductor or a large-value capacitor. As a result, these current sources internal to a multiple of transconductors are required to maintain powered on for all time, and consuming considerable amount of power, even in idle mode of these active filters constructed utilizing transconductors.

SUMMARY OF THE INVENTION

It is therefore an object of the present invention to provide a silicon active analog filtering buffer apparatus having improved filtering characteristics.

It is another object of the present invention to provide a silicon active analog filtering buffer apparatus having simplified filter architecture.

It is still another object of the present invention to provide a silicon active analog filtering buffer apparatus having reduced operational power consumptions, especially at the output.

It is yet another object of the present invention to provide a silicon active analog filtering buffer apparatus having reduced physical dimensions suitable for component miniaturization.

It is yet another object of the present invention to provide a silicon active analog filtering buffer apparatus having improved and simplified filter design by employing waveform shaping of the input signal.

It is still yet another object of the present invention to provide a silicon active analog filtering buffer apparatus having improved and simplified filter design without having to conduct complex computation for the filter coefficients.

The present invention achieves the above-identified objects by providing a silicon active analog filtering buffer apparatus and its method of operation to receive an input signal and generates a synthesized output signal. The apparatus comprises a pulse generator for receiving the input signal and producing a sequence of delayed signal pulses in response to the input signal. A control logic circuit is connected to the pulse generator for generating scheduling on/off operation control signals. An array of switched current sources includes a number of switch means each connected to the control logic for receiving a corresponding "one" of the generated scheduling on/off operation control signals for shaping pre-determined waveforms. An output stage provides an amplified current output for shaping to form the synthesized output signal. No complex computational procedure is necessary for the creation of the output filtered signal. Power consumption, as well as device physical dimensional characteristics are both reduced. Improvements of filter characteristics are achieved.

BRIEF DESCRIPTION OF THE DRAWINGS

Other objects, features, and advantages of the present invention will become apparent by way of the following detailed description of the preferred but non-limiting embodiments. The description is made with reference to the accompanied drawings in which.

DETAILED DESCRIPTION OF THE PREFERRED EMBODIMENT

The present invention provides a silicon filtering buffer apparatus that employs the general operating principle of a digital FIR filter but is implemented as an analog filter apparatus. In other words, the silicon filtering buffer apparatus of the present invention is an active analog filter device that employs a modified-principle for the operation of a conventional digital FIR filter. Before a description of the preferred embodiment of the silicon filtering buffer apparatus of the present invention as well as the method of its operation is elaborated, an examination of a typical digital FIR filter device suffices to assist in better understanding the present invention.

Figure 1:
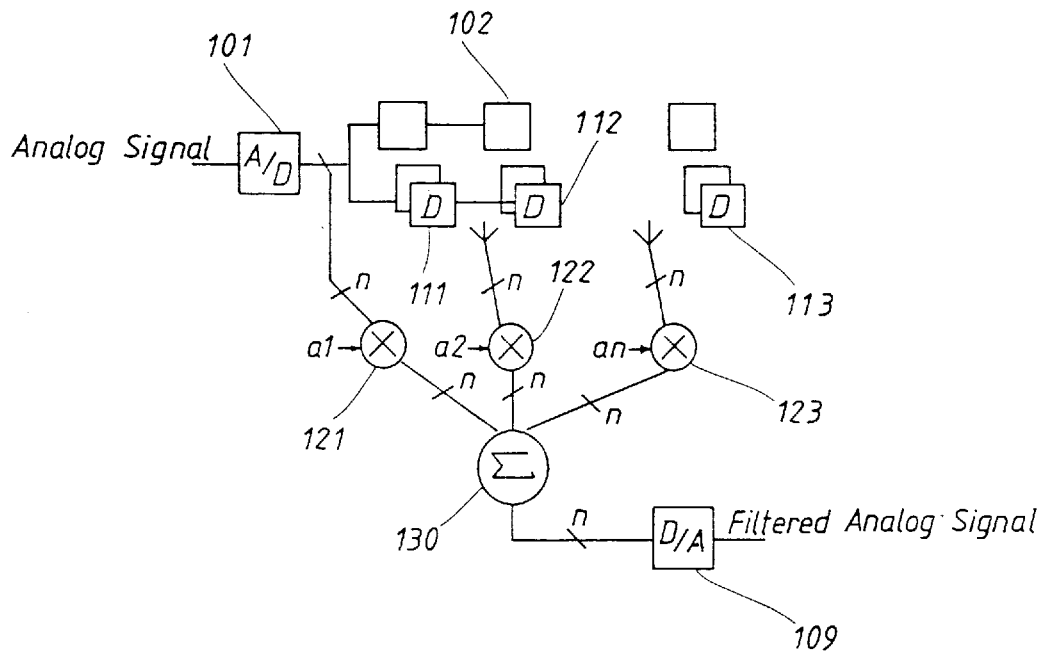
FIG. 1 shows architectural configuration of a conventional digital FIR filter device depicting the operating principle thereof.

FIG. 1 of the accompanying drawing of the present invention is a diagram that serves to schematically depict the operating principle of a digital FIR filter. The conventional digital FIR filter receives an analog input signal, converts it into digital data, performs the filtering operation thereon, and re-converts the processed (filtered) digital data back into its original analog form for output. This fact is reflected in the schematic block diagram of FIG. 1, in which the filter device includes an A/D converter 101 at the signal input end and a D/A converter 109 at the filtered signal output end.

As is seen in the drawing, between the ends of the input A/D converter 101 and the output D/A converter 109, the digital FIR filter comprises a series of a multiple of single-bit delay elements 111–113 each clocked by a system clock source 102. Each bit of the multiple-bit delay elements 111–113 is further connected to a corresponding digital multiplier 121–123, this is for fetching its delayed multiple-bit output for multiplication to a value determined by a control factor a1–an input to that particular multiplier. Outputs of all the digital multipliers 121–123 are then connected to a digital adder 130 for summation of all the multiple-bits.

In the case of this depicted conventional digital FIR filter device, there is an entire array of digital hardware installed between the input A/D and output D/A converters that are synchronously driven by one clock source 102. The design methodology of this digital FIR filter device is to establish the desired device filtering operation by finding a set of optimized coefficients a1, . . . , an in the frequency domain. The mathematical solution to this set of optimized coefficients a1–an is the key to the acceptable filter operation characteristics of the digital FIR filter device thus constructed.

As persons skilled in the art may well appreciate, and realizing that time and frequency domains are substantially equal in their own right, the digital FIR filter design methodology may be modified by altering the principle of curve-fitting the a1, . . . , an coefficients in the time domain into obtaining an optimized and suitable filter specification in the frequency domain. This allows for the implementation of an active analog filter apparatus utilizing simplified design while obtaining improved device filtering characteristics. This methodology alteration constitutes the basis for the construction of the silicon filtering buffer apparatus of the present invention.

Figure 2:
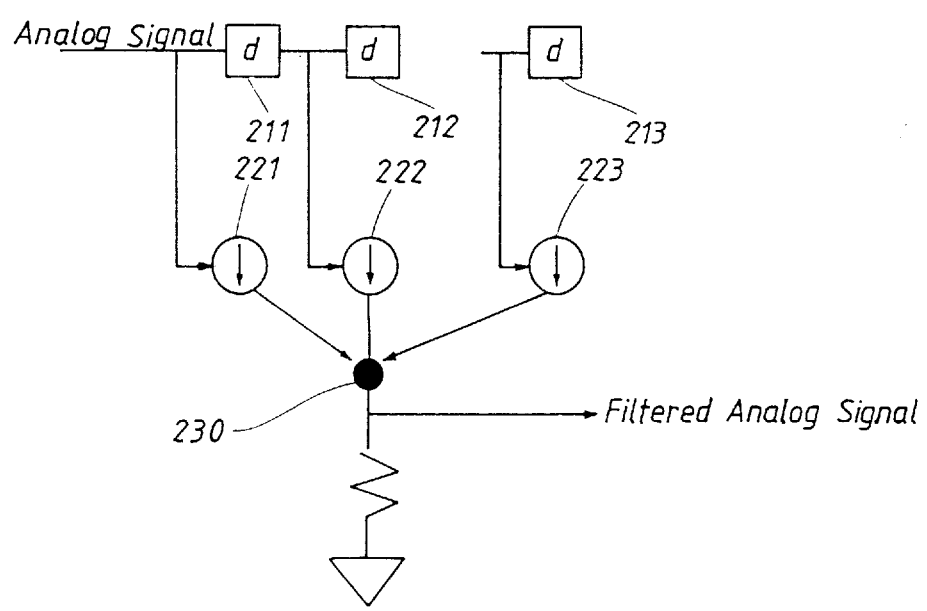
FIG. 2 shows the basic architectural configuration of the active analog filtering buffer apparatus in accordance with a preferred embodiment of the present invention.

Needless to go into rigorous proof for the above-outlined principle, a methodology is proposed by the present invention that selects a few representative waveforms and designs a hardware as embodied in FIG. 2 for curve-fitting the given input waveforms. Successful curve-fitting results allow for obtaining a desired filter device specification. Computer simulation results and substantial semiconductor samples have confirmed the usefulness of the methodology of the present invention.

A silicon filtering buffer apparatus based on the modified technique of digital FIR filter employing switch-current source technique in the time-domain may generally comprise a N-bit delay line, switches, weighted current-sources, and a current summing node. The N-bit delay line essentially converts the analog input signal into an N-bit output. The m-th output of the delay line is multiplied by the filter coefficient a which is implemented by a current source to generate a weighted, delayed product term. The product terms are summed at the current-summing node to produce a filtered analog output. The multiplication of delay element output and filter coefficients can be implemented with a switch controlled by the output of the delay element of the delay line. The analog output waveform is thereof the sum of all current sources for which the corresponding switches are on.

Refer to FIG. 2 of the drawing. With a comparison of FIGS. 2 to 1, it is obvious to note the architectural similarity between the two. Observing the structural similarity between the conventional digital FIR filter device of FIG. 1 and the active analog filter apparatus of FIG. 2, it can be seen that the analog delay elements 211–213 of FIG. 2 is functionally equivalent to the digital multiple-bit delay elements 111–113 of FIG. 1, although the former handles analog waveforms while the latter handles series of digital 0's and 1's. Analog delay elements 211–213 of the active analog filter apparatus of FIG. 2 is further operated in an asynchronized scheme as opposed to the synchronized scheme for the digital delay elements 111–113 of the conventional digital FIR filter device of FIG. 1. Essentially each of the analog delay elements 211–213 is a pulse-delaying circuit. All the analog delay elements 211–213 in the array of FIG. 2 are connected in cascade that comprise the pulse generator mentioned above, with a multiple of pulse waveforms of differently delayed timings that may be extracted from the output taps at the various stages in the cascade.

Each of the controlled current sources 221–223 of FIG. 2 is equivalent to one of the digital multipliers 121–123 in FIG. 1. Again, these controlled current sources are operated in an asynchronized scheme. As persons skilled in the art may well appreciate, each of these current sources 221–223 may be fabricated in silicon in a much smaller physical size than its counterpart, namely, the digital multipliers 121–123 in the conventional digital FIR filter of FIG. 1. Finally, the simple current summing node identified by the reference numeral 230 in FIG. 2 is functionally equivalent to the complex digital adder 130 of FIG. 1. The different sizing of current sources 221 to 223 of FIG. 2. represent the parameters a1, a2, and an of FIG. 1.

In the outlined embodiment of FIG. 2 of the silicon filtering buffer apparatus of the present invention, the input analog signals may be square waves of certain frequencies. The desirable outputs, i.e., filtered analog signals, are sinusoidal waveforms of the corresponding frequencies. This is the case of Low Pass Filtering. Nevertheless, this invention is not restricted to only Low Pass filtering, it can be a applied equally well to High Pass, and Band Pass filtering. Thus, as is obvious from comparison, the A/D converter 101 and D/A converter 109 are not necessary in the implementation of the silicon active analog filtering buffer apparatus of the present invention.

In essence, the silicon filtering buffer apparatus of the present invention achieves to improve and simplify the active analog filter design. This is done by employing to shape the waveform in a relatively easy scheme, rather than conducting the complex computation of the filter characteristic coefficients.

Figure 3:
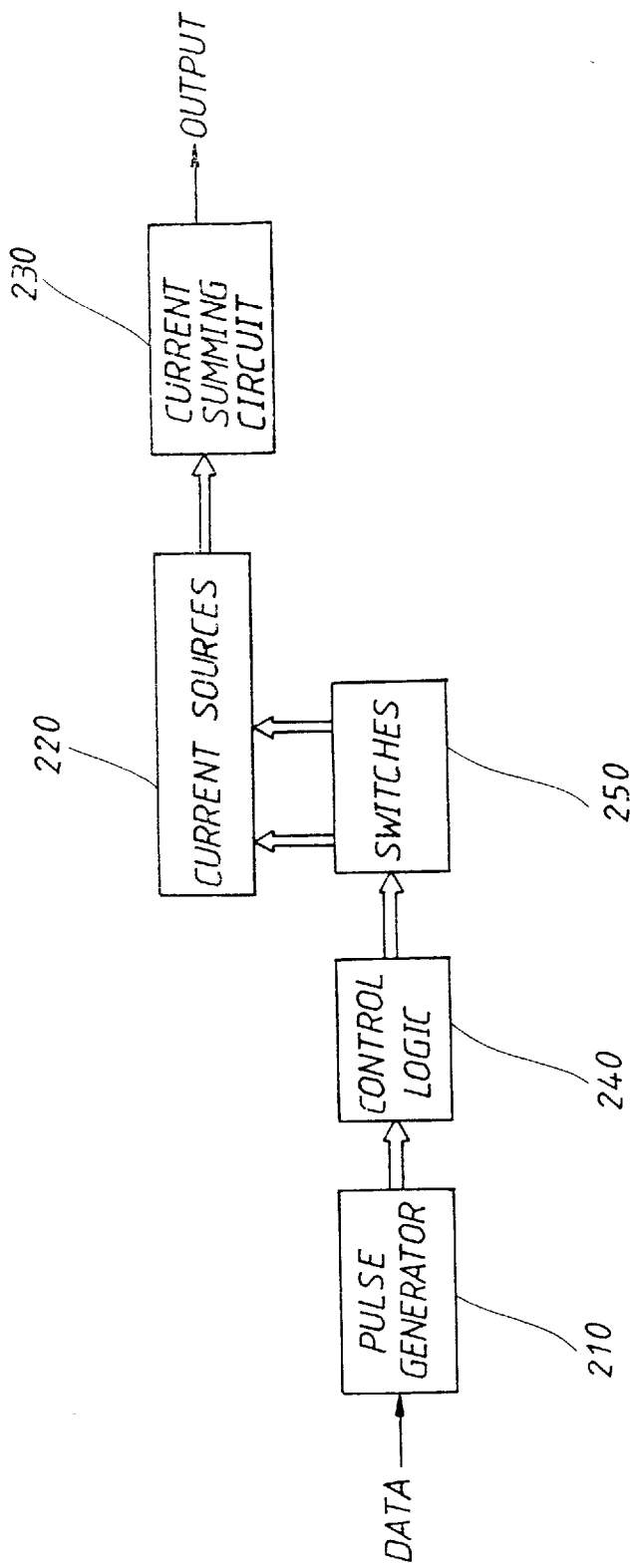
FIG. 3 is a block diagram showing the main functional modules of an embodiment of the silicon active analog filtering buffer apparatus of the present invention.

FIG. 3 is a block diagram showing the main functional modules of an embodiment of the silicon active analog filtering buffer apparatus of the present invention. The system comprises a pulse generator 210, a control logic 240, an array of switches 250, an array of weighted switched current sources 220, and a current summing circuit 230. This embodied active analog filtering system receives data in analog waveforms and produces a desirable multiple-level and continuous signal at the output.

In the system of FIG. 3, essentially the pulse generator 210 receives analog data signals and produces a sequence of pulses with differently delayed timings. These pulses are then sent to the control logic circuit 240 to generate the appropriate control signals that may be fed to the switch array 250, whose outputs are applied to pre-coded current sources 220, as would be exemplified and described in detail in FIG. 4. All weighted currents are then summed in a simple wired-or connection to yield the overall output. Each current source together with its corresponding switch form a basic unit that is referred to as switched current source hereafter, and the output waveform is determined by the summation of the current sources each characterized by the different weightings thereof.

Figure 4:
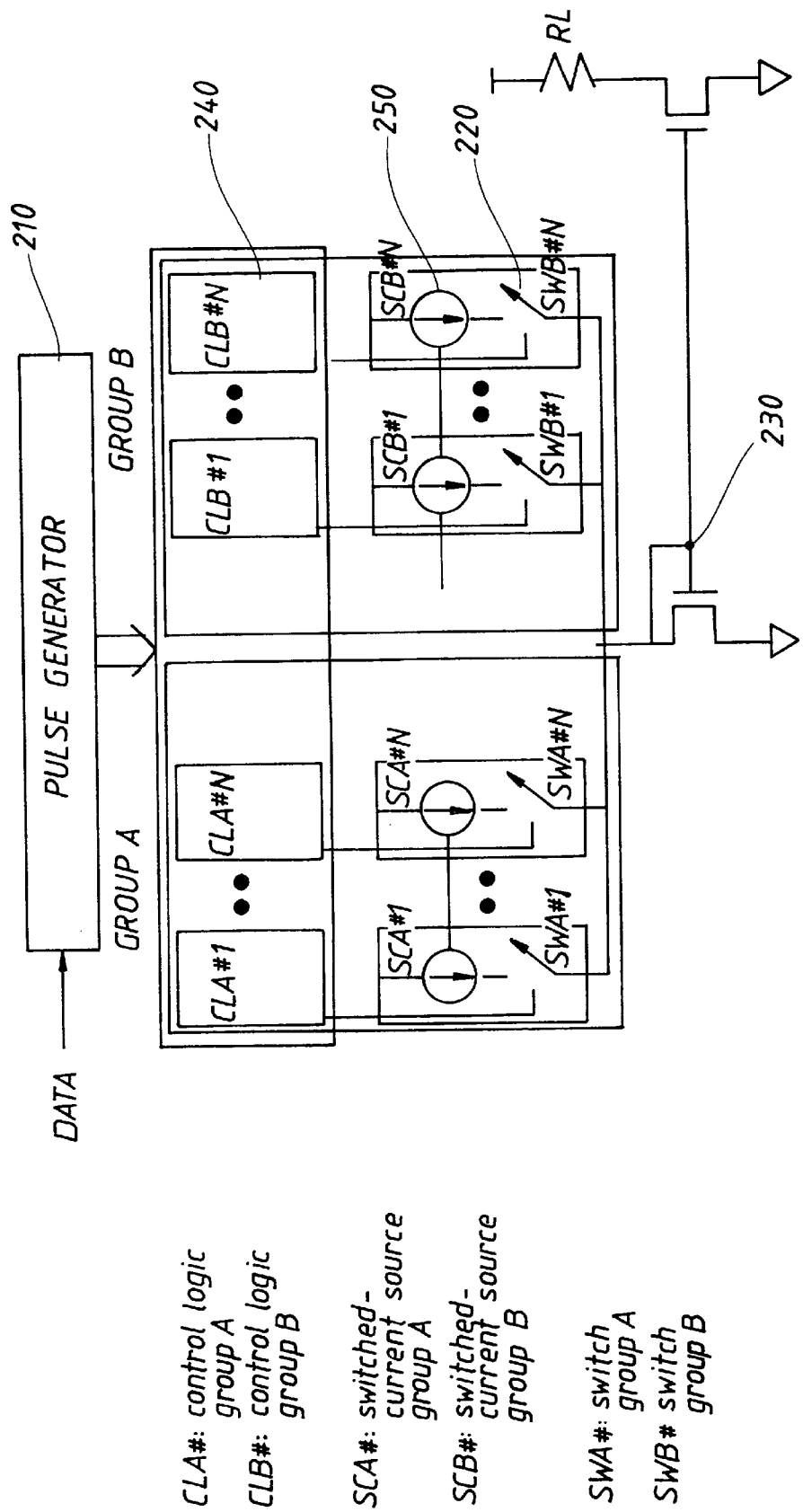
FIG. 4 shows the block diagram of an embodiment of the active analog filtering buffer apparatus of the present invention.

FIG. 4 shows the block diagram of an embodiment of the active filtering buffer apparatus of the present invention. As is seen in the drawing, the control logic 240, switches 250 as well as the array of switched current sources 220 of FIG. 3, are each divided into two groups A and B. Essentially, group A of control logic 240 in the embodiment of FIG. 4 comprises control logic circuits CLA#1, . . . , CLA#N, while group B of control logic comprises control logic circuits CLB#1, . . . , CLB#N. On the other hand, group A of the array of switched current sources 220 in the embodiment comprises switched current sources SCA#1, . . . , SCA#N, while group B comprises switched current sources SCB#1, . . . , SCB#N.

Note, further, that each of the control logic circuits CLA#1, . . . , CLA#N and CLB#1, . . . CLB#N has an accompanying switch means SWA#1, . . . , SWA#N and SWB#1, . . . , SWB#N respectively, as may be observed in the drawing of FIG. 4.

At the array of switched current sources 220 of FIG. 4, by changing the weighting distribution of the current sources SCA#1, . . . , SCA#N and SCB#1, . . . SCB#N, it is possible to synthesize a sinusoidal wave at the current summing node 230 for an input waveform with a resolution of arbitrary N bits, where N is the number of the switched current sources in the array 220. The amplitude of the synthesized sinusoidal wave may be controlled at its destination. In the case of this depicted embodiment, it can be achieved by adjusting the current ratio of the current mirror 260.

Figure 5:
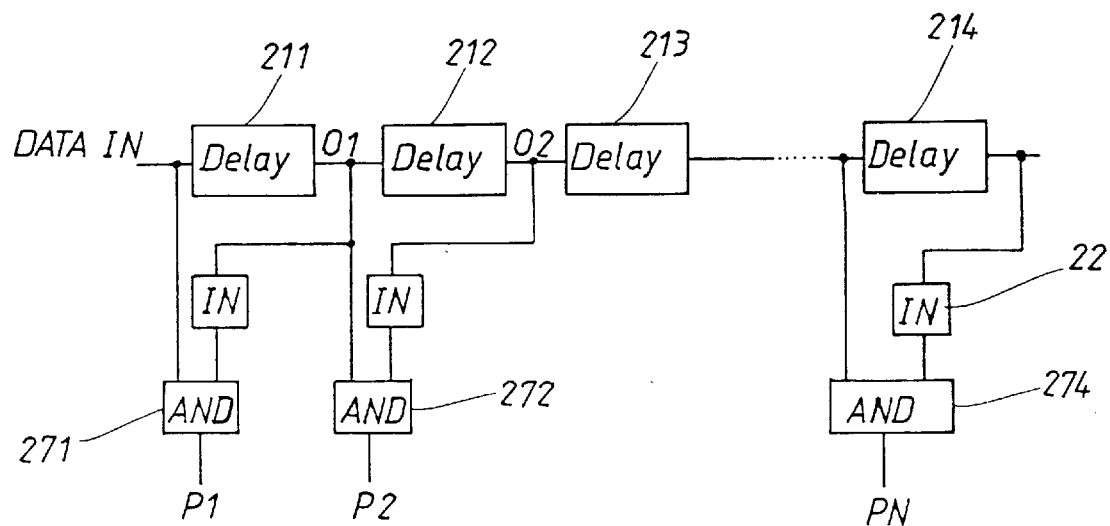
FIG. 5 shows the block diagram of an embodiment of the pulse generator of FIGS. 3 and 4.

FIG. 5 shows the block diagram of an embodiment of the pulse generator 210 of FIGS. 3 and 4. The pulse generator 210 consists of an array of signal delay means, such as the delay elements 211–214 arranged in a cascaded array having N signal delay taps extracted at the output of each of the delayed stages.

Figure 6:
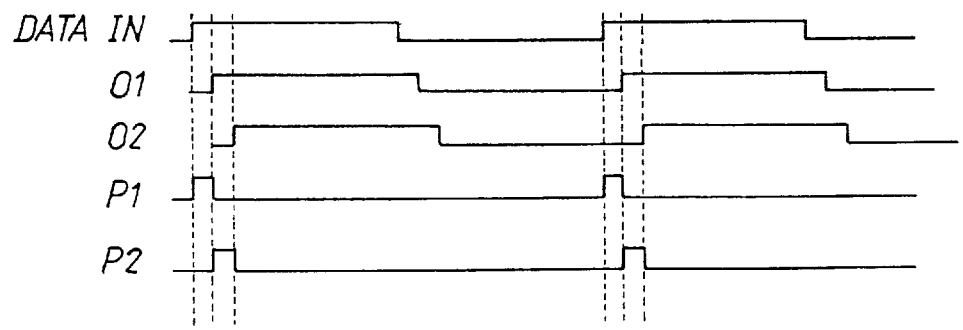
FIG. 6 is a timing diagram depicting the relative relationship between the input data signal and a couple of tapped delay element outputs, as well as their respective gated output pulses in the pulse generator of FIG. 5.

Each of the basic constituent components of the pulse generator 210, as described above, is a delay element 211–214 with its associated logic gates 271–274. Output of each of the delay element 211–214 is connected to the input of the delay element at its cascaded next stage, as well as to the input of its corresponding one of the logic gates 271–274, which are AND gates in this depicted embodiment. With the construction of this cascaded array of delay elements 211–214, data may be shifted into and propagated downstream along the cascade of the delay elements. With the functional aid of logic gates 271–274, the signal delaying array may be able to produce a set of signal pulses P1, . . . , PN. Timing of the output of the m-th delay element Pm in the delaying array is that of the input signal delayed by a time m×τ, where τ is the unit delay time of a delay element. FIG. 6 depicts a timing diagram showing the relative relationship between the input data signal DATAIN and a couple of tapped delay element outputs O1 and O2, as well as their respective gated output pulses P1 and P2.

As is observable in the drawing, the signal pulse in the input data signal DATAIN is delayed at the first stage of delay element 211 as reflected by the pulse waveform identified by O1. Pulse O2 is further delayed than O1. With the AND-gate functionality implemented, the P1 and P2 signal pulse become successive short burst of pulses as seen in the drawing.

The appearance of a particular pulse as tapped at the output of one delay element in the cascaded array 210 represents the delayed time duration of the input into the system. Therefore, that pulse is a time-dependent function of the input signal, and can be used as the control signal that can be fed to the control logic 240. The task of control logic 240 is to govern the on/off timing of each switched current source utilizing the pulses which contains its corresponding timing information.

Since current sources are used for the purpose of curve-fitting the desired output waveform, they would each acquire relatively different current output amplitudes resulted from the application of the weighting. Based on the input signal, if the filtered output waveform is to be shape-fitted into a sine wave, then selective summation of current sources of the filtering buffer apparatus would have to be coded in sine-wave magnitudes. In other words, a set of differently-scaled current sources will be needed. The different weightings may be established utilizing the method of linear interpolation.

Thus, the switch means of each of the switched current sources in the array 250 of FIGS. 3 and 4 should be operated in a scheme based on the principle of "first-on last-off," so as to obtain a symmetric output waveform. Various arrangements of these circuits may be utilized to implement the necessary "first-on last-off" timing scheme. The use of signal latches is one of the most straightforward implementations of the control logic 240 for the management of signal timing. Each of the switched current sources has a logic control unit associated therewith. In other words, each switch is correspondingly linked to the latched output of the logic control unit.

A latch may be considered as a storage element that can maintain its data content for arbitrary periods. As is familiar by persons skilled in the art, a typical signal latching circuit may have two control inputs, say SET and RESET, for example. The application of strobing signals at these data latching status inputs would allow the latching circuit to enter either of its corresponding data latching SET and RESET states. This makes these signal latching circuit means suitable for current switching control.

Assume SET is a control input that places the signal latch into its data set state. That is, the Q output of latch becomes logical high whenever SET input is set to logic high. Analogously, a high RESET input would reset the latch by making its Q output becoming logically low. The latching circuit will remain its previous data state so long as there is no signal status change in the control inputs.

The corresponding switch operation employing latch means for implementing the control logic 240 in the embodiment of FIG. 4 is as follows. If SET input is set to high, Q output of the latch means connected to the switch would become high, and the switch turned on as the switched current source supplies current I that contributes to the summing node 230. This situation continues until a RESET input pulse is received. In this case, output Q of the latch circuit would be set to low and the switch turned off. Current I is then stopped from adding to the summing node 230.

Thus, groups A and B of the control logic 240 may each consist N latches each having two control inputs, SET and RESET respectively as described above. Scheduling means that can be timely switched may be utilized to control groups A and B of the array of switched current sources 220 by issuing suitably arranged timing signals from the pulse generator 210 to the two control inputs of these N latches in both the A and B groups. FIG. 7B provides an example of the control timing diagram for switches SW#1, SW#2, SW#9 and SW#10 in both A and B groups shown in FIG. 4. These switches are controlled by the control logic 240, with logic "0" representing a turned-on switch, and a logic "1" signifying a turned-off one. Each switch that is turned on adds a sine-weighted increment of current to the current summation node 230. In order to maintain precision delay, a charge-pump phase-locked loop (PLL) device is used. This PLL calibrates the delay per stage of the array of delay elements. In this manner, accurate timing control for the filtered signal may be achieved. Thus, the array of delay elements 210 essentially converts the serial input into N bits of parallel signals. The analog output is therefore the sum of all current sources for which the corresponding switches thereof controlled by the outputs of the corresponding delay elements are switched on.

A silicon active analog filtering buffer apparatus in accordance with the disclosure of the present invention and having an array of delay elements with 20 tapped delay outputs was designed and fabricated in a 1.2 $\mu$m CMOS process. Fully differential filters are being developed and will be described in the following. Current-to-voltage conversion is possible using current-mode signal processing circuit such as operational amplifiers.

The invention finds its applications in the digital transmission systems such as, for example, local area network (LAN) systems. A digital differential signal is frequently used for protecting a signal from the interference of noise signals. The signal being protected may need to be transmitted along a signal transmission line, such as a twist-pair cable commonly found in the connection framework of LAN's. A filter for the digital differential signal suitable for Ethernet 10-Base-T application is basically made of two strings of the form shown in FIG. 3. One of the string is fed with positive signal, DATAP, the other is fed with negative signal, DATAN.

DATAP and DATAN are digital differential signals, Manchester encoded, and shift between two frequencies 10 and 5 MHz, so as to provide at least one transition per bit cycle. The filter shapes the output waveform and feeds to the twist-pair cable. The output pairs to the twist-pair wires, OUTPUTP and OUTPUTN, are pre-distorted to meet the 10-Base-T jitter template requirements outlined in IEEE Std. 802.3.

The pre-distortion algorithm improves the jitter performance by reducing the amplitude level to a certain extent during the second half of the 5 MHz component of the Manchester encoded signal. The twist-pair cable will decrease the voltage of the 10 MHz signal more than of the 5 MHz signal. As a result, the pre-distortion ensures that both the 5 and 10 MHz components will have the same amplitude at the far end receiver. The system employs a center tap 2:1 transformer where the center tap is tied to Vcc (+5V).

Figure 7A:
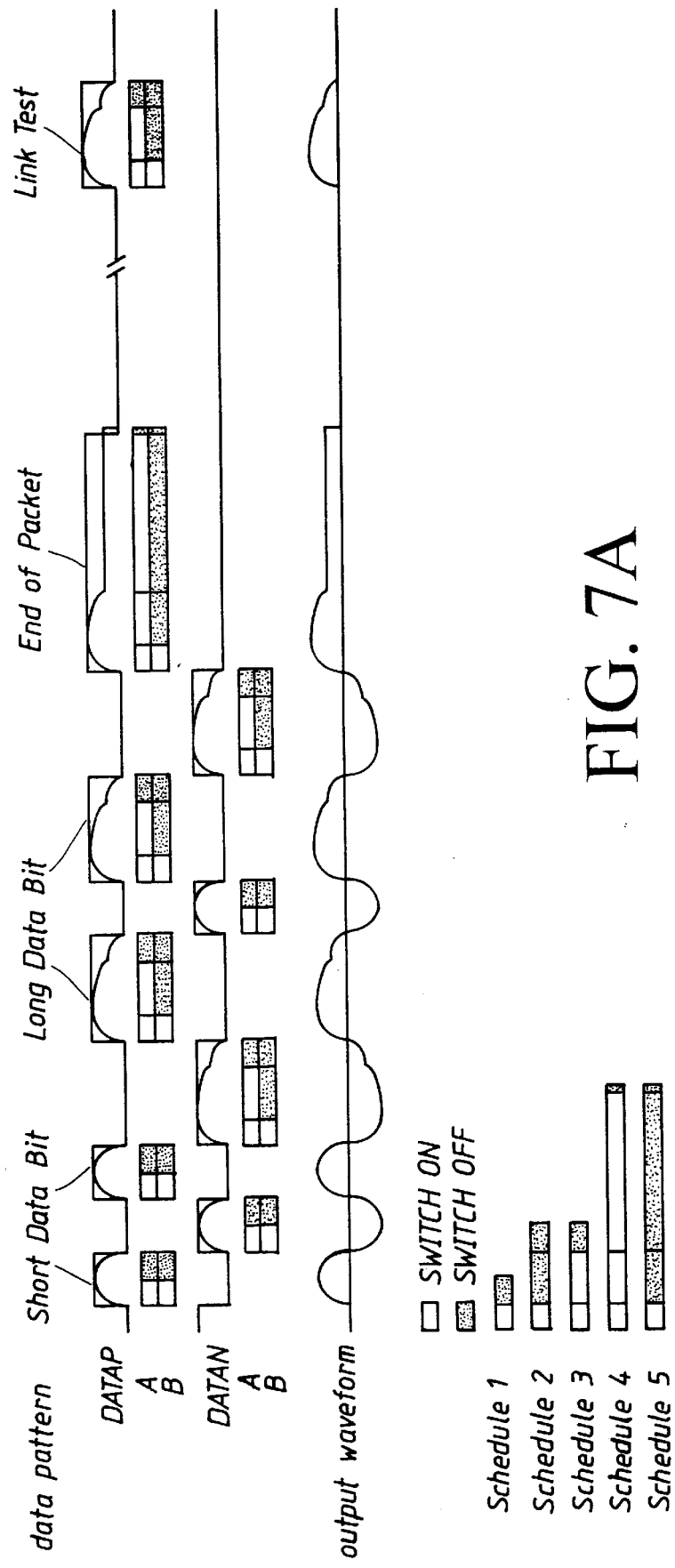
FIG. 7A is a timing diagram showing to contain the four possible data patterns that may be generated by an embodiment of the present invention in a network controller device.
Figure 7B:
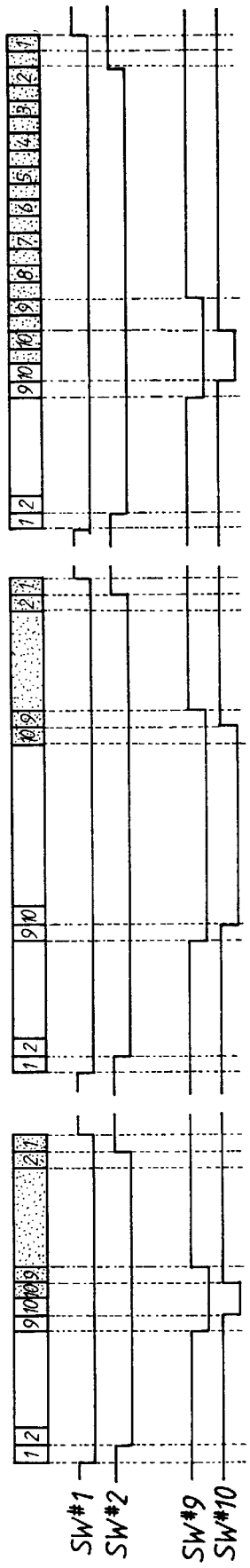
FIG. 7B provides an example of the control timing for switches in both A and B groups of the switched current sources of FIG. 4.

In the case of the active analog filter for the digital differential signal suitable for Ethernet 10-Base-T LAN application, four possible data patterns may be produced by the network controller which are 5 MHz (long data bit), 10 MHz (short data bit), end of packet, and link tests signals as shown in the timing diagram of FIG. 7A. Without alteration to the array of switched current sources 220 of FIGS. 3 and 4, the control logic provides an effective means of satisfying the needs described above by trading circuit complexity for signal amplitude flexibility.

Five signal filter controlling schedules, namely, the five combinations of switch on/off timing sequences outlined as Schedules 1–5 in FIG. 7A for the on/off switching of the switched current sources should be determined based on the timing pulses generated by the pulse generator. This ensures the production of the output waveform corresponding to the input. In order to detect the data pattern of the incoming data, the DATAP is delayed by about 50 ns. These comparisons make it possible to tell the difference between these four data patterns and select one of those five Schedules 1–5 for controlling the switched current sources. The control algorithm is described in the following paragraph.

The control logic block is responsible for two main controlling functions that include selection and switching of the switched current sources in the array. The control logic for the control of selection is responsible for collecting the pulses, selecting and dispatching appropriate pulses to the switching control. Switching control logic, on the other hand, is basically comprised of a multiple of signal latches as described above.

Figure 8A:
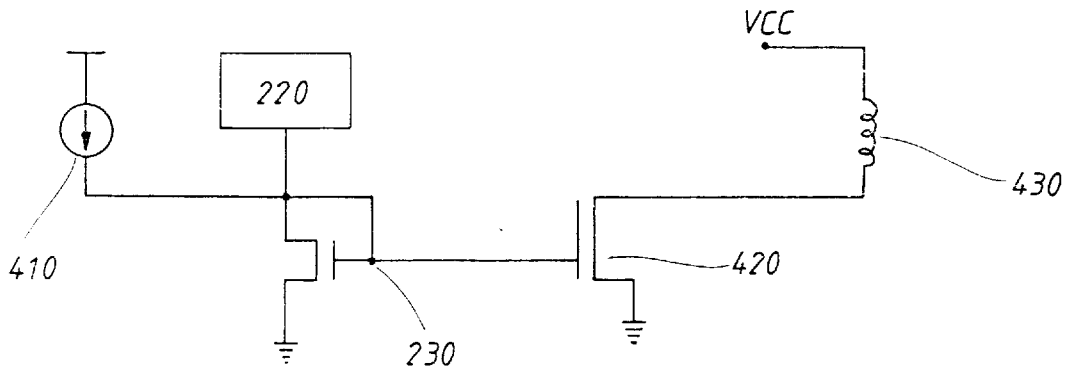
FIG. 8A is shown a circuit of Output Driver of the present invention.
Figure 8B:
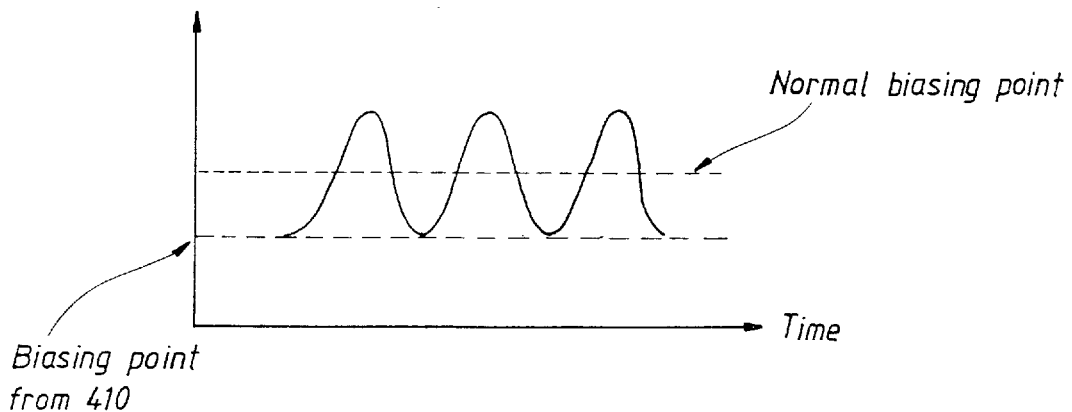
FIG. 8B is shown a diagram of biasing method of the present invention.

Please refer to FIGS. 8A and 8B, the output of an Analog filter must be able to drive a significant loading without much distortion. The current summing node 230 in FIG. 8A is connected to an output driving transitor 420, a desirable waveform at its gate. One features of the present invention is in including biasing point 410. If without this arrangement, transitor 420 will be turned off or in Class B operation mode. This causes a great deal of distortion at loading 430. Specifically, transistor 420 must be put into Class A operation mode where its output is linearly proportional to its input. A DC biasing current source 410 is always pumping current into current summing node 230 to keep transistor 420 slightly On. As signal starts to come in from block 220, transistor 220 will be turned ON further in a manner linearly proportional to its input. This is different from the normal Class A operation where biasing point is set in the middle of a desirable waveform. This approach allows the device to save more power during idle mode (No signal from 220)

Thus, with the proper manipulation of the waveform shaping as described above, the silicon active analog filtering buffer apparatus of the present invention is capable of improving the filter characteristics with simplified structure and reduced complexity. Power consumption as well as physical dimension are both reduced. Tedious and complex filter characteristics coefficient computation procedure are no more necessary.

As persons skilled in the art may well appreciate, the above description of the preferred embodiments of the present invention is intended for the description, not for the restriction against the scope of the present invention. For example, since the wave shape table is arbitrary, the output waveforms are not necessarily limited to sine waves. Such modifications to the outlined embodiments of the present invention may be apparent and should be considered to be within the scope of the present invention recited in the claimed section that follows.

What is claimed is:

1. A filtering buffer apparatus receiving an input signal and generating a synthesized output signal, said apparatus comprising:

a pulse generator means for receiving said input signal in analog waveform and producing a sequence of delayed signal pulses in response to said input signal;

a control logic means connected to said pulse generator means for generating scheduling on/off operation control signals;

an array of switched current sources including a plurality of switch means each connected to said control logic for receiving a corresponding one of said generated scheduling on/off operation control signals for shaping pre-determined waveforms; and an output stage connected to said array of switched current sources for providing an amplified current output for shaping to form said synthesized output signal;

said output stage including a current summing node, wherein said synthesized output signal is determined by a summation of said current sources each having a different weight.

2. The filtering buffer apparatus of claim 1, wherein said pulse generator means comprises an array of a plurality of delay elements connected in cascade, and each of said plurality of delay elements having a corresponding logic gate connected thereto.

3. The filtering buffer apparatus of claim 2, wherein the output of each of said plurality of delay elements is connected to the input of said corresponding gate logic as well as to the input of the next cascaded delay element stage.

4. The filtering buffer apparatus of claim 3, wherein said plurality of delay elements are analog signal delay lines.

5. The filtering buffer apparatus of claim 1, wherein said control logic means comprises two groups of control logic circuits.

6. The filtering buffer apparatus of claim 5, wherein one group of said control logic circuits controls positively-shaped waveform portion of said synthesized output signal, and the other group controls negatively-shaped waveform portion of said synthesized output signal.

7. The filtering buffer apparatus of claim 1, wherein said array of switched current sources comprises two groups of switched current sources.

8. The filtering buffer apparatus of claim 7, wherein one group of said switched current sources switches into positively-shaped waveform portion of said synthesized output signal, and the other group switches into negatively-shaped waveform portion of said synthesized output signal.

9. The filtering buffer apparatus of claim 1, wherein every current source has a different weight, and the wave form of said synthesized output signal is not limited to sinusoidal wave form.

10. The filtering buffer apparatus of claim 1, wherein the control logic means ensures a symmetrical output for square wave by scheduling switching in a first on last off manner.

11. A method for generating filtered output in a filtering buffer apparatus, said apparatus receiving an input signal and generating a synthesized output signal, said apparatus comprises a pulse generator means, a control logic means, an array of switched current sources, and an output stage, said method comprising the steps of:

said pulse generator means receiving said input signal and producing a sequence of delayed signal pulses in response to said input signal;

said control logic means connected to said pulse generator means generating scheduling on/off operation control signals;

said array of switched current sources includes a plurality of switch means each connected to said control logic, said array of switched current sources receiving a corresponding one of said generated scheduling on/off operation control signals for shaping pre-determined waveforms; and said output stage providing an amplified current output for shaping to form said synthesized output signal wherein said synthesized output signal is determined by a summation of said current sources each having a different weight.

12. The method of claim 11, wherein said pulse generator means comprises an array of a plurality of delay elements connected in cascade, and each of said plurality of delay elements having a corresponding logic gate connected thereto.

13. The method claim 12, wherein the output of each of said plurality of delay elements is connected to the input of said corresponding logic gate as well as to the input of the next cascaded delay element stage.

14. The method claim 13, wherein said plurality of delay elements are analog signal delay lines.

15. The method of claim 11, wherein said control logic means comprises two groups of control logic circuits.

16. The method claim 15, wherein one group of said control logic circuits controls positively-shaped waveform portion of said synthesized output signal, and the other group controls negatively-shaped waveform portion of said synthesized output signal.

17. The method of claim 11, wherein said array of switched current sources comprises two groups of switched current sources.

18. The method of claim 17, wherein one group of said switched current sources switches into positively-shaped waveform portion of said synthesized output signal, and the other group switches into negatively-shaped waveform portion of said synthesized output signal.

19. The method of claim 18, wherein the output transistor is biasing by a DC current source and operated in class A mode.

20. The method of claim 11, wherein every current source has a different weight, and the control logic means ensures a symmetrical output for square wave by scheduling switching in a first on last off manner, and the waveform of said synthesized output signal is not limited to sinusodal wave form.

* * * * *